(12) United States Patent
Yan et al.

(10) Patent No.: US 12,575,432 B2
(45) Date of Patent: Mar. 10, 2026

(54) CHIP FINE LINE FAN-OUT PACKAGE STRUCTURE AND MANUFACTURING METHOD THEREFOR

(71) Applicant: Shenzhen Xiuyuan Electronic Technology Co., Ltd., Shenzhen (CN)

(72) Inventors: Yingqiang Yan, Guangzhou (CN); Yao Wang, Guangzhou (CN); Chuan Hu, Guangzhou (CN); Xun Xiang, Guangzhou (CN); Zhitao Chen, Guangzhou (CN)

(73) Assignee: Shenzhen Xiuyuan Electronic Technology Co., Ltd., Shenzhen (CN)

( * ) Notice: Subject to any disclaimer, the term of this patent is extended or adjusted under 35 U.S.C. 154(b) by 535 days.

(21) Appl. No.: 18/015,576

(22) PCT Filed: Jul. 27, 2020

(86) PCT No.: PCT/CN2020/104923
§ 371 (c)(1),
(2) Date: Jan. 11, 2023

(87) PCT Pub. No.: WO2022/021018
PCT Pub. Date: Feb. 3, 2022

(65) Prior Publication Data
US 2023/0253333 A1 Aug. 10, 2023

(51) Int. Cl.
*H01L 23/538* (2006.01)
*H01L 21/48* (2006.01)
(Continued)

(52) U.S. Cl.
CPC ...... *H01L 23/5383* (2013.01); *H01L 21/4857* (2013.01); *H01L 24/16* (2013.01);
(Continued)

(58) Field of Classification Search
CPC . H01L 25/0655; H01L 21/56; H01L 21/4857; H01L 23/5383; H01L 23/5384;
(Continued)

(56) References Cited

U.S. PATENT DOCUMENTS 8,901,748 B2 * 12/2014 Manusharow ...... H01L 23/5385
257/652
9,640,521 B2 * 5/2017 Chang .................... H01L 24/16
(Continued)

FOREIGN PATENT DOCUMENTS

CN 107104096 8/2017
CN 109087908 12/2018
(Continued)

OTHER PUBLICATIONS

International Search Report in PCT/CN2020/104923 dated Apr. 30, 2021.

*Primary Examiner* — Lawrence C Tynes, Jr.
(74) *Attorney, Agent, or Firm* — Dicke, Billig & Czaja, PLLC

(57) ABSTRACT

Provided are a chip fine line fan-out package structure and a manufacturing method therefor. The chip fine line fan-out package structure provided and the chip fine line fan-out package structure manufactured using the manufacturing method each include an inter-chip fine wiring layer and a package wiring layer. The line width and line spacing of the inter-chip fine wiring layer are less than the line width and line spacing of the package wiring layer, and therefore, a user can choose to use different package wiring layers according to actual needs. Therefore, the chip fine line fan-out package structure and the package structure manufactured using the manufacturing method can meet the use demands of users in more scenarios.

20 Claims, 4 Drawing Sheets

(51) Int. Cl.

| | | |
|---|---|---|
| *H01L 23/00* | (2006.01) | |
| *H01L 25/00* | (2006.01) | |
| *H01L 25/065* | (2023.01) | |

(52) U.S. Cl.
  CPC .............. *H01L 24/32* (2013.01); *H01L 24/73* (2013.01); *H01L 25/0655* (2013.01); *H01L 25/50* (2013.01); *H01L 2224/16227* (2013.01); *H01L 2224/32225* (2013.01); *H01L 2224/73204* (2013.01)

(58) Field of Classification Search
  CPC ......... H01L 24/24; H01L 24/82; H01L 24/19; H01L 2224/18
  See application file for complete search history.

(56) References Cited

U.S. PATENT DOCUMENTS

| | | | | |
|---|---|---|---|---|
| 9,653,428 B1 * | 5/2017 | Hiner | ...................... | H01L 24/73 |
| 2014/0091474 A1 * | 4/2014 | Starkston | ............... | H01L 24/06 361/767 |

| | | | | |
|---|---|---|---|---|
| 2015/0318246 A1 * | 11/2015 | Yu | ........................... | H01L 25/50 257/774 |
| 2016/0218092 A1 * | 7/2016 | Chang | ................. | H01L 23/5383 |
| 2018/0102311 A1 * | 4/2018 | Shih | .................... | H01L 25/0655 |
| 2018/0211929 A1 * | 7/2018 | Bae | ..................... | H01L 25/0655 |
| 2018/0294241 A1 * | 10/2018 | Chen | .................. | H01L 23/5381 |
| 2018/0301351 A1 | 10/2018 | Cheng et al. | | |
| 2018/0308789 A1 | 10/2018 | Zhao et al. | | |
| 2020/0381361 A1 | 12/2020 | Zhao et al. | | |
| 2021/0074645 A1 * | 3/2021 | Tsai | ................... | H01L 25/0655 |

FOREIGN PATENT DOCUMENTS

| | | |
|---|---|---|
| CN | 110197793 | 9/2019 |
| CN | 111370385 | 7/2020 |

* cited by examiner

CHIP FINE LINE FAN-OUT PACKAGE STRUCTURE AND MANUFACTURING METHOD THEREFOR

CROSS-REFERENCE TO RELATED APPLICATION

This Utility Patent Applications claims priority under 35 U.S.C. § 371 to International Application Serial No. PCT/CN2020/104923, filed Jul. 27, 2020, which is incorporated herein by reference in its entirety.

TECHNICAL FIELD

The present application relates to the field of chip technology, and in particular, to a chip fine line fan-out package structure (i.e., fine line fan-out package structure for chip) and a manufacturing method therefor.

BACKGROUND ART

The developments of technologies, such as 5G mobile Internet, artificial intelligence, Internet of Things, autonomous driving, and high-performance computing, require that the semiconductor devices, such as integrated circuits, are to be widely used. Moreover, according to different usage scenarios and requirements, the requirements for the transmission rate, power consumption and other indicators of the circuit are also different. However, the existing chip fine circuit fan-out package structures are difficult to meet various needs of users.

SUMMARY

The present application provides a chip fine line fan-out package structure and a manufacturing method therefor, the purposes of which at least comprise solving the problem that the existing chip fine line fan-out package structure is difficult to meet various needs of users.

The embodiments of the present application can be implemented as follows.

In a first aspect, the present application provides a chip fine line fan-out package structure, comprising a plurality of chips and a plurality of wiring layers, wherein each of the chips comprises devices and pins which comprise high-density inter-chip interconnection pins and low-density chip interconnection pins, the plurality of wiring layers comprise inter-chip fine wiring layers and package wiring layers, and the inter-chip fine wiring layers have a line width and a line spacing which are smaller than those of the package wiring layers, the inter-chip fine wiring layers are connected to the chips through the high-density inter-chip pins, and manufacturing of the fine line fan-out package structure comprises:

laying a first insulating layer on a temporary support material, and making the inter-chip fine wiring layers grow on the first insulating layer, using an adhesive material to complete alignment-bonding and curing of the pins of the inter-chip fine wiring layers and the plurality of chips, encapsulating the chips with an encapsulation material, and then removing the temporary support material, forming first interconnection holes on the inter-chip fine wiring layers, and providing a conductive material in the first interconnection holes to realize electrical connection between the chip and the inter-chip fine wiring layers, and forming at least one package wiring layer on the first insulating layer, and providing insulating layers between the package wiring layers, wherein the package wiring layers are connected to the chip or other wiring layers through the interconnection holes filled with conductive material.

Optionally, an adhesive layer is formed by insulating adhesive material or anisotropic conductive material, so that a side of the chip where pins are located is attached to the inter-chip fine wiring layer which is most adjacent, and the pins of the chip are precisely aligned with the inter-chip fine wiring layers.

Optionally, the first interconnection hole penetrates through the first insulating layer, the inter-chip fine wiring layers and the adhesive layer, to reach the high-density inter-chip pins of the chip, the first interconnection hole is filled with conductive material, and the inter-chip fine wiring layer realizes a high-density inter-chip pin electrical interconnection between different chips through the conductive material filled in the first interconnection hole.

Optionally, the insulating layers comprise a second insulating layer, the interconnection holes comprise a second interconnection hole, the package wiring layers comprise a first package wiring layer, the second insulating layer covers the first insulating layer and the first interconnection hole, the first package wiring layer is disposed on the second insulating layer, the second interconnection hole penetrates through the first insulating layer and the second insulating layer to reach the inter-chip fine wiring layer, and/or, penetrates through the second insulating layer, the first insulating layer, the inter-chip fine wiring layer, and the adhesive layer to reach the low-density chip interconnection pins, only sidewalls of the second interconnection hole are coated with conductive material to realize an electrical interconnection between the first package wiring layer and the inter-chip fine wiring layer and/or the low-density chip interconnection pins.

Optionally, the insulating layers further comprise a third insulating layer, the interconnection holes further comprise a third interconnection hole, the package wiring layers further comprise a second package wiring layer, the third insulating layer covers the first package wiring layer, material of the third insulating layer fully fills the second interconnection hole, the third interconnection hole penetrates through the third insulating layer, the second package wiring layer is arranged on the third insulating layer and electrically connected to the first package wiring layer through conductive material in the third interconnection hole.

Optionally, a line width and a line spacing of the package wiring layers are larger than those of the inter-chip fine wiring layers, each of the inter-chip fine wiring layers is of 0.5-2 microns, and a line width and a line spacing of the first package wiring layer are 2-5 microns.

Optionally, line widths and line spacings of all the wiring layers comprising the inter-chip fine wiring layers and the package wiring layers are gradually increasing in a direction away from the chip, and line widths of other packaging wiring layers except the first packaging wiring layer are more than 5 microns.

Optionally, material of the first insulating layer and the insulating layers between the individual packaging wiring layers comprises at least one of polyimide, benzocyclobutene (BCB), parylene, industrialized liquid crystal polymer (LCP), epoxy resin, oxide of silicon, nitride of silicon, ceramic, oxide of aluminum, and glass.

Optionally, conductive materials in the first interconnection hole, the second interconnection hole and the third interconnection hole are at least one of copper, aluminum, tungsten, conductive paste, tin-silver alloy, tin-silver-copper alloy, and gold-tin alloy.

In a second aspect, the present application provides a manufacturing method of a chip fine line fan-out package structure, comprising:

forming sequentially a first insulating layer, an inter-chip fine wiring layer and an adhesive layer, on a surface of one side of the temporary support material;

mounting a plurality of chips to be attached to one side of the adhesive layer away from the inter-chip fine wiring layer, wherein pins of the chips comprise high-density inter-chip interconnection pins and low-density chip interconnection pins, and the pins of the chip are precisely aligned with the inter-chip fine wiring layer;

encapsulating the plurality of chips using encapsulating material, and covering the adhesive layer;

removing the temporary support material;

forming a first interconnection hole on the first insulating layer, wherein the first interconnection hole penetrates through the first insulating layer, the inter-chip fine wiring layer and the adhesive layer and exposes high-density inter-chip pins of the chip, the first interconnection hole is filled with conductive material to make the inter-chip fine wiring layer electrically connected with the high-density inter-chip pins of the chip;

coating a second insulating layer on the first insulating layer then, wherein the second insulating layer covers the first insulating layer and the first interconnection hole, a first package wiring layer is formed on the second insulating layer; forming a second interconnection hole, wherein the second interconnection hole penetrates through the first package wiring layer, the second insulating layer, the first insulating layer and the inter-chip fine wiring layer and exposes the low-density chip interconnection pins, and/or, penetrates through the first package wiring layer, the second insulating layer, and the first insulating layer and exposes the inter-chip fine wiring layer; the second interconnection hole is filled with conductive material, and the low-density chip interconnection pins are electrically connected to the inter-chip fine wiring layer and the first package wiring layer through the conductive material in the second interconnection hole;

forming alternately at least one insulating layer and at least one package wiring layer on the first packaging wiring layer in a direction of away from the chip, wherein interconnection holes are formed on each insulating layer, and the interconnection holes are filled with conductive material; and forming an electrical connection between individual packaging wiring layers through conductive material in the interconnection holes, wherein a line width and a line spacing of the inter-chip fine wiring layers are smaller than those of individual packaging wiring layers; and providing a pin pad on the package wiring layer farthest from the chip, wherein a solder resist layer covers the package wiring layer farthest from the chip, and the solder resist layer at least partially covering the pin pad is removed, and solder balls grow on the pin pad.

Optionally, a line width and a line spacing of the wiring layers, comprising the inter-chip fine wiring layer, the first packaging wiring layer and other packaging wiring layers, gradually increase in a direction away from the chip.

Optionally, by conductive material in the second interconnection hole, the low-density chip interconnection pins are electrically connected with the first package wiring layer, and/or the inter-chip fine wiring layer is electrically connected with the first package wiring layer.

Optionally, conductive material is coated on sidewalls and a bottom of the second interconnection hole, and remaining space in the second interconnection hole is fully filled with the material of the third insulating layer, or the second interconnection hole is fully filled with conductive material.

Optionally, the step of filling the conductive material in each of the interconnection holes comprises:

forming, by magnetron sputtering or electroless plating, seed layer metal on sidewalls and a bottom of the interconnection holes, and filling conductive material in the interconnection holes by electroplating process; or filling fully conductive material in the interconnection holes by method of screen/stencil printing conductive material.

Optionally, the interconnection holes are formed by means of laser drilling, or formed by means of photolithography and dry etching.

The beneficial effects of the embodiments of the present application comprise, for example, the follows.

As for the chip fine line fan-out package structure provided by the embodiments of the present application, and the chip fine line fan-out package structure manufactured by the manufacturing method provided by the embodiments of the present application, the wiring layer comprises the inter-chip fine wiring layer and the packaging wiring layer, which have different line widths and line spacings, so that users can choose to use different wiring layers according to actual needs. Therefore, the chip fine line fan-out package structure provided by the present application and the package structure prepared by the manufacturing method provided by the present application can meet the needs of users in more scenarios.

BRIEF DESCRIPTION OF DRAWINGS

In order to illustrate the technical solutions of the embodiments of the present application more clearly, the drawings that need to be used in the embodiments will be briefly introduced below. It should be understood that the following drawings only show some embodiments of the present application, and therefore should be regarded as a limitation on the scope. For those skilled in the art, other related drawings can also be obtained according to these drawings without any creative efforts.

Figure 1:
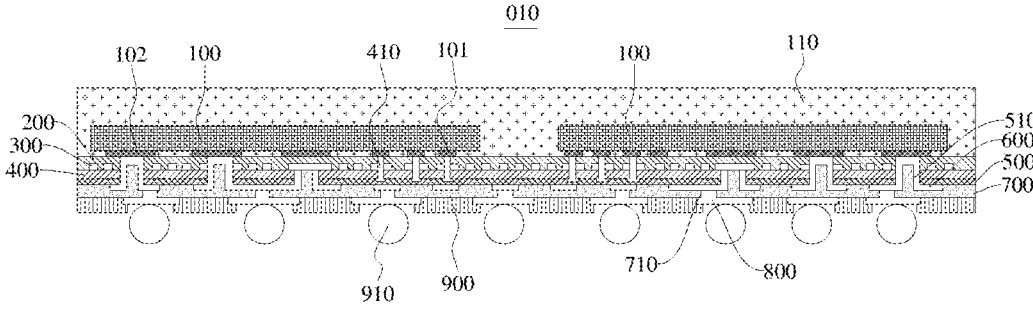
FIG. 1 is a schematic diagram of a chip fine line fan-out package structure in an embodiment of the present application.

Reference Numbers: 010—chip fine line fan-out package structure; 100—chip; 101—high-density inter-chip interconnection pin; 102—low-density chip interconnection pin; 110—encapsulation material; 200—adhesive layer; 300—inter-chip fine wiring layer; 400—first insulating layer; 410—first interconnection hole; 500—second insulating layer; 510—second interconnection hole; 600—first package wiring layer; 700—third insulating layer; 710—third interconnection hole; 800—second package wiring layer; 900—solder resist layer; 910—solder ball; 020—temporary support material.

DETAILED DESCRIPTION OF EMBODIMENTS

In order to make the purposes, technical solutions and advantages of the embodiments of the present application clearer, the technical solutions in the embodiments of the present application will be described clearly and completely below with reference to the drawings in the embodiments of the present application. Obviously, the described embodiments are part, but not all, of the embodiments of the present application. Generally, the components of the embodiments of the present application described and illustrated in the drawings herein may be arranged and designed in a variety of different configurations.

Thus, the following detailed description of the embodiments of the application provided in the drawings is not intended to limit the scope of the application as claimed, but is merely representative of selected embodiments of the application. Based on the embodiments in the present application, all other embodiments, obtained by those skilled in the art without creative work, fall within the protection scope of the present application.

It should be noted that similar reference numerals and letters refer to similar items in the following figures, so that once an item is defined in one figure, it is not required to further define and explain it in subsequent figures.

In the description of the present application, it should be noted that, if the orientation or position relationship indicated by terms, "upper", "lower", "inner", "outer", etc. appear, it is based on the orientation or position relationship shown in the drawings, or based on the orientation or position relationship in which the product of the present application is usually placed in when in use. This is only to facilitate the description of the present application and to simplify the description, rather than indicating or implying that the referred device or element must be at a specific orientation, or be constructed and operated in a specific orientation, and therefore should not be construed as a limitation on the present application.

In addition, the appearance of the terms, "first", "second", "third", etc., is only used to describe the distinguishing, and should not be construed as indicating or implying the importance of relativity.

It should be noted that the features in the embodiments of the present application may be combined with each other under the condition of no conflict.

FIG. 1 is a schematic diagram of a chip fine line fan-out package structure 010 in an embodiment of the present application. The chip fine line fan-out package structure 010 comprises a chip 100 and a plurality of wiring layers, and the plurality of wiring layers comprise an inter-chip fine wiring layer 300 and a plurality of packaging wiring layers. The chip 100, the inter-chip fine wiring layer 300 and a plurality of packaging wiring layers are arranged as stacked, and the pins of the chip 100 are electrically connected to the inter-chip fine wiring layer 300 or at least one packaging wiring layer through the electrical interconnection holes. The inter-chip fine wiring layers 300 or the packaging wiring layers are all electrically connected to the chip 100 or at least one of the other package wiring layers through electrical interconnection holes. The inter-chip fine wiring layers 300 have line widths and line spacings different from each package wiring layer. Particularly, the line width and the line spacing of the inter-chip fine wiring layers 300 are smaller than the line width and the line spacing of individual package wiring layers. The number of chips 100 included in the chip fine line fan-out package structure 010 can be determined according to needs, such as two as shown in the drawings. Of course, it can also comprise one chip 100, and the chip 100 are connected to other components through the inter-chip fine wiring layer 300 or the package wiring layers. Alternatively, the chip fine line fan-out package structure 010 may comprise three or more chips 100. It should be understood that the different line widths and line spacings in the embodiments of the present application refer to: the line widths of different wiring layers are different, and the line spacings of different wiring layers are also different. As shown in FIG. 1, a chip fine line fan-out package structure 010 provided by an embodiment of the present application comprises, arranged layer by layer, chips 100, an adhesive layer 200, an inter-chip fine wiring layer 300, a first insulating layer 400, a second insulating layer 500, a first packaging wiring layer 600, a third insulating layer 700, a second packaging wiring layer 800, a solder resist layer 900 and solder balls 910. The chip 100 is encapsulated by an encapsulation material 110. As shown in FIG. 1, the encapsulation material 110 can completely cover the chip 100, or the top of the chip 100 can be exposed. It should be understood that, in this embodiment, the multiple packaging wiring layers only comprise the first packaging wiring layer 600 and the second packaging wiring layer 800. In other optional embodiments of the present application, the number of packaging wiring layers may be two or more.

In an optional embodiment, the inter-chip fine wiring layer 300 is electrically connected to the high-density inter-chip interconnection pins 101 of the chip 100 through the first interconnection holes 410. It should be understood that the interconnection holes (comprising the first interconnection hole 410, the second interconnection hole 510, and the third interconnection hole 710) in the embodiments of the present application are all electrification hole structures. Through the conductive material coated on the inner wall and bottom of the interconnection holes or filled in the interconnection holes (such as, metal or other non-metal conductive material), it is enabled that the interconnection holes realize the function of conducting electricity. Optionally, the first interconnection hole 410 penetrates through the lines of the inter-chip fine wiring layers 300 and extends to the high-density inter-chip interconnection pins 101 of the chips 100. The first interconnection hole 410, through being electroplated with copper, realizes the electrification, such that it electrically connects the inter-chip fine wiring layer 300 with the high-density inter-chip interconnection pins 101 of the chip 100. In the embodiment of FIG. 1, the electroplated copper is filled in the first interconnection hole 410. Of course, in other optional embodiments, the electroplated copper may be only coated on the inner wall of the first interconnection hole 410.

The first package wiring layer 600 is electrically connected to the inter-chip fine wiring layer 300 and/or the low-density chip interconnection pins of the chip 100 through the electrification second interconnection hole 510. As shown in FIG. 1, there are three types of second interconnection holes 510. In one type, after passing through the second insulating layer 500 and the first insulating layer 400, the second interconnection hole passes through the lines of the inter-chip fine wiring layer 300, and then passes through the adhesive layer 200 to reach the pins of the chip 100, so that the first package wiring layer 600, the inter-chip fine wiring layer 300 and the low-density chip interconnection pins 102 of the chip 100 are electrically connected. In another type, the second interconnection hole 510, after passing through the second insulating layer 500 and the first insulating layer 400, passes through the inter-chip fine wiring layer 300, but avoids the lines on the inter-chip fine wiring layer 300, and then passes through the adhesive layer 200 to reach the pins of the chip 100, so that the electrical connection between the first package wiring layer 600 and the chip 100 is realized. In the third type, the second interconnection hole 510 only electrically connects the first package wiring layer 600 and the inter-chip fine wiring layer 300.

A third insulating layer 700, which is located between the second packaging wiring layer 800 and the first packaging wiring layer 600, make them spaced from each other. The second packaging wiring layer 800, through the electrification third interconnection hole 710, is connected with the inter-chip fine wiring layer 300, the first package wiring layer 600 and/or the pins of the chip 100. As shown in FIG. 1, in an optional embodiment, the second package wiring layer 800 and the first package wiring layer 600 are electrically connected through third interconnection hole 710.

A solder resist layer 900 is formed on the side of the second package wiring layer 800 away from the chip 100. The solder resist layer 900 exposes part of the lines of the second package wiring layer 800 through the gap, and the solder balls 910 are connected with lines of the second package wiring layer 800 through the gap.

In the embodiment of the present application, the line width and the line spacing are different depending on the individual wiring layers of the chip fine line fan-out package structure 010. Optionally, in the direction away from the chip 100, the line width and line spacing are gradually increased. Specifically, in the embodiment of FIG. 1, the line width and the line spacing of the inter-chip fine wiring layer 300 can be selected as 0.5-2 microns, the line width and the line spacing of the first package wiring layer 600 can be selected as 2-5 microns, and the line width and the line spacing of the second package wiring layer 800 can be selected as more than 5 microns, which provides the user with a variety of alternative solutions, capable of meeting the different needs of the user.

In an optional embodiment of the present application, the material of each wiring layer can be selected from titanium, copper, silver or their alloys. The material of the first insulating layer 400 and the insulating layers between the individual package wiring layers (comprising the second insulating layer 500 and the third insulating layer 700) comprises at least one of polyimide, benzocyclobutene (BCB), parylene, industrialized liquid crystal polymer (LCP), epoxy resin, oxide of silicon, nitride of silicon, ceramic, oxide of aluminum, and glass. In this embodiment, the first insulating layer 400 may be of a polymer (such as, parylene epoxy resin), an inorganic material (such as, silicon dioxide, silicon nitride, etc.), or a ceramic film (alumina, aluminum nitride, silicon carbide, etc.). The adhesive material may be an insulating DAF film or other insulating materials with an adhesive function. The material of the second insulating layer 500 may be a permanent photoresist, a photoresist dry film, or a non-photosensitive polymer, an inorganic substance, a ceramic film, or the like. The third insulating layer 700 may be of a photosensitive/non-photosensitive material, which may be PI, BCB, parylene or epoxy resin (DAF film). The conductive material filled in each interconnection hole may be metals, such as copper, aluminum and tungsten, or anisotropic conductive adhesive, conductive paste, or alloys, such as tin-silver, tin-silver-copper, and gold-tin, etc.

Of course, the package structure may be a BGA, or a surface mount package type (thus omitting the solder balls 910 and omitting the BGA ball mounting process).

The present application further provides a manufacturing method of a chip fine line fan-out package structure, which can be used to produce the chip fine line fan-out package structure 010 provided in the embodiment of the present application. The manufacturing method comprises: sequentially manufacturing a first insulating layer, an inter-chip fine wiring layer and an adhesive layer on the surface of one side of the temporary support material; attaching a plurality of chips on the side of the adhesive layer away from the inter-chip fine wiring layer, wherein the pins of the chip comprise high-density inter-chip interconnection pins and low-density chip interconnection pins, and the pins of the chip and the inter-chip fine wiring layers are precisely aligned; and encapsulating the plurality of chips with encapsulation material and covering the adhesive layer;

removing the temporary support material; forming a first interconnection hole on the first insulating layer, wherein the first interconnection hole penetrates through the first insulating layer, the inter-chip fine wiring layer and the adhesive layer and exposes the high-density inter-chip pins of the chip, and the first interconnection hole is filled with conductive material, so as to make the inter-chip fine wiring layer electrically connected with the high-density inter-chip pins of the chip;

making a second insulating layer coated on the first insulating layer, wherein the second insulating layer covers the first insulating layer and the first interconnection holes, a first package wiring layer is formed on the second insulating layer; forming the second interconnection holes, wherein the second interconnection hole penetrates through the first package wiring layer, the second insulating layer, the first insulating layer and the inter-chip fine wiring layer and exposes low-density chip interconnection pins, and/or, penetrates through the first package wiring layer, the second insulating layer, and the first insulating layer and exposes the inter-chip fine wiring layer; filling the conductive material in the second interconnection hole, and electrically connecting the low-density chip interconnection pins and the inter-chip fine wiring layer and the first package wiring layer through the conductive material in the second interconnection hole;

forming alternately at least one insulating layer and at least one package wiring layer on the first package wiring layer in the direction away from the chip, forming an interconnection hole on each insulating layer, and filling the interconnection holes with conductive material; forming an electrical connection between individual package wiring layers through the conductive material in the interconnection holes; and providing a pin pad on the package wiring layer farthest from the chip, making the solder resist layer cover the package wiring layer farthest from the chip, and removing at least part of the solder resist layer covering the pin pad; and planting solder balls on the pin pad.

Figure 2:
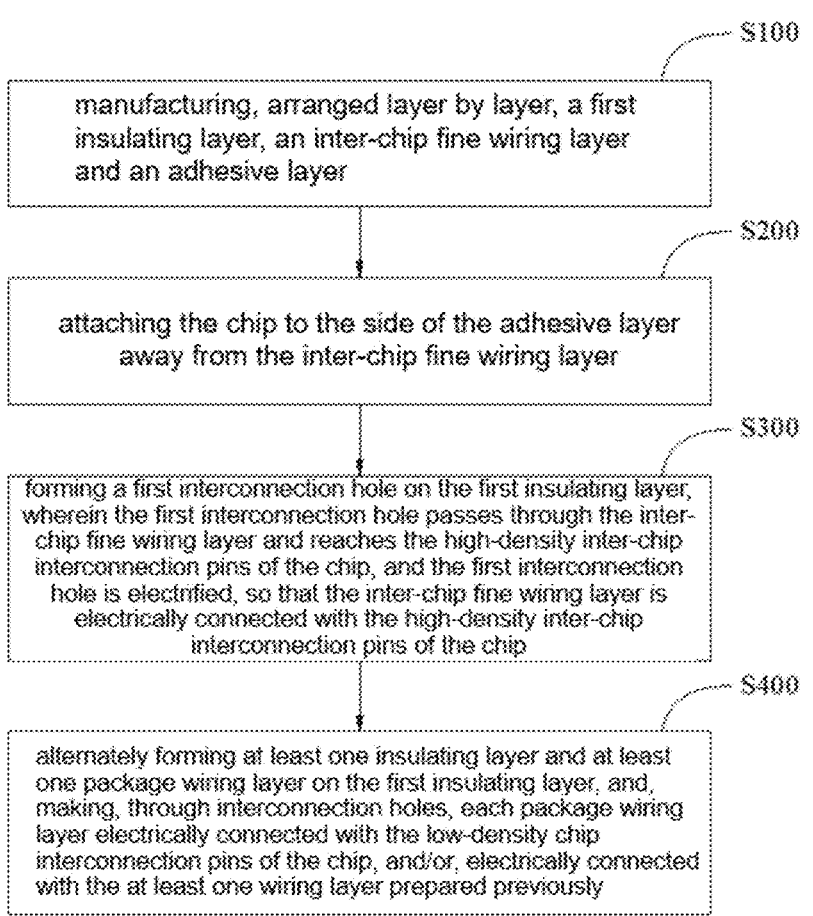
FIG. 2 is a flowchart of a manufacturing method of a chip fine line fan-out package structure in an embodiment of the present application.

FIG. 2 is a flowchart of a manufacturing method of a chip fine line fan-out package structure 010 in an embodiment of the present application. As shown in FIG. 2, in this embodiment, the manufacturing method comprises:

Step S100, manufacturing, layer by layer, a first insulating layer, an inter-chip fine wiring layer and an adhesive layer on the temporary support material;

Step S200, attaching the chip to the side of the adhesive layer away from the inter-chip fine wiring layer, wherein the high-density inter-chip interconnection pins and the inter-chip fine wiring layer are precisely aligned;

Step S300, forming a first interconnection hole on the first insulating layer, wherein the first interconnection hole passes through the inter-chip fine wiring layer and reaches the high-density inter-chip interconnection pins of the chip, and the first interconnection hole is electrified, so that the inter-chip fine wiring layer is electrically connected with the high-density inter-chip interconnection pins of the chip; and Step S400, alternately forming at least one insulating layer and at least one package wiring layer on the first insulating layer, and, making, through interconnection holes, each package wiring layer electrically connected with the pins of the chip, and/or, electrically connected with the at least one package wiring layer prepared previously, wherein the line widths and line spacings of the individual package wiring layers comprising the inter-chip fine wiring layers are different.

The chip fine line fan-out package structure 010 with multi-layer wiring layers can be produced by the manufacturing method provided in the embodiment of the present application. The multi-layer wiring layers comprise the inter-chip fine wiring layer 300 and the multi-layer package wiring layers. The inter-chip fine wiring layer 300 connects individual chips, and the line width and the line spacing thereof are smaller than those of the package wiring layer. Because the package structure has wiring layers with different line widths and line spacings and they are electrically connected to each other or to the pins of the chip 100, the chip fine line fan-out package structure 010 can meet the different needs of users.

FIGS. 3 to 14 are schematic diagrams of the chip fine line fan-out package structure 010 in the manufacturing process according to an embodiment of the present application. The above Steps S100 to S400 are described below, with the fabrication of the chip fine line fan-out package structure 010 in the embodiment of FIG. 1 as an example.

In Step S100, a first insulating layer, an inter-chip fine wiring layer and an adhesive layer are formed, layer by layer, on the temporary support material.

Figure 3:
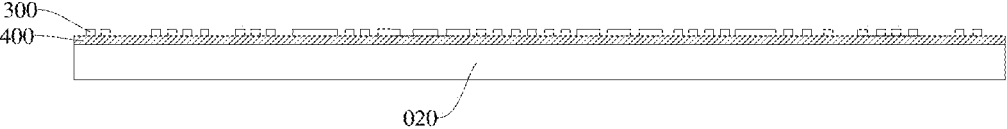
FIGS. 3 to 15 are schematic diagrams of a chip fine line fan-out package structure in a manufacturing process according to an embodiment of the present application.
Figures 4, 5, 6, 7, 8:
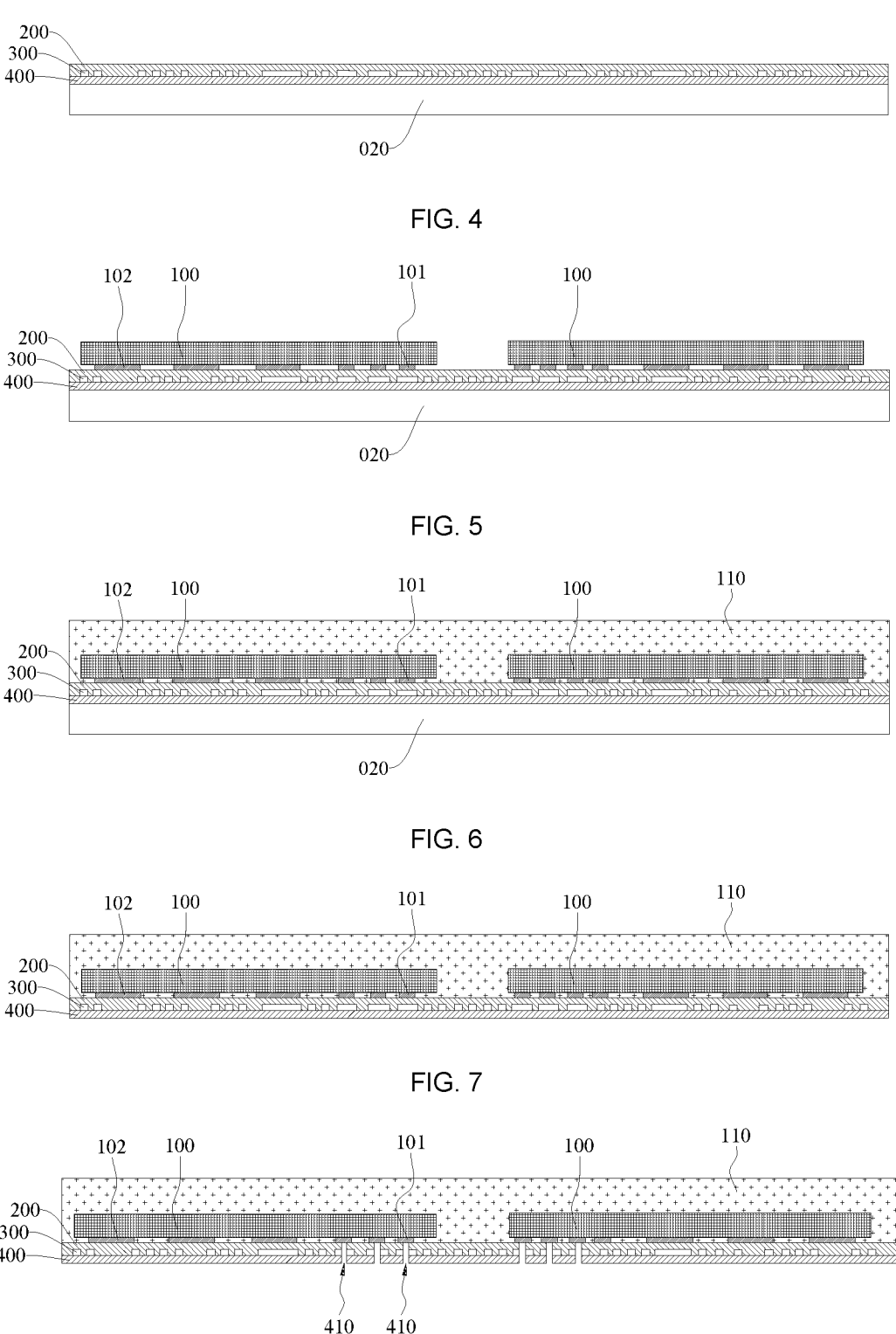

In an optional embodiment, Step S100 may specifically comprise: forming a first insulating layer 400 on the temporary support material 020; forming an inter-chip fine wiring layer 300 on the first insulating layer 400 (as shown in FIG. 3); and forming an adhesive layer 200 formed by an adhesive material on the inter-chip fine wiring layer 300 (as shown in FIG. 4). Optionally, the material of the temporary support material 020 comprises: metal, glass, silicon or ceramic. The temporary support material 020 is removed before forming the first interconnection holes 410.

Optionally, the step of forming the inter-chip fine wiring layer 300 on the first insulating layer 400 may specifically comprise: sputtering metal material onto the first insulating layer 400, and using photolithography or etching to form the inter-chip fine wiring layer 300, or sputtering a seed layer onto the first insulating layer 400, and using the photolithography or copper electroplating process to form an inter-chip fine wiring layer 300. The metal material and the seed layer can be selected from titanium, copper, silver, or their alloys, wherein the photolithography comprises making the photoresist form a line pattern (by means of photolithography, etc.). The etching comprises removing the metal not covered by the photoresist, using dry or wet methods, removing the photoresist, and forming the inter-chip fine wiring layer 300 by the remaining metal.

In step S200, a chip is attached on the side of the adhesive layer away from the inter-chip fine wiring layer.

As shown in FIG. 5, the side of the chip 100 with the pins is attached to the adhesive layer 200. At this time, the high-density inter-chip interconnection pins 101 and the low-density chip pins 102 of the chip 100 are not in electrical connection relationship with the inter-chip fine wiring layer 300. It can be selected that the number of chips 100 is plural. After the chip 100 is mounted, the chip 100 is packaged by an encapsulation material. As shown in FIG. 6, the chip 100 can be completely encapsulated; or the upper surface of the chip 100 can be exposed. After packaging, the temporary support material 020 used for support is removed to facilitate subsequent processing on the first insulating layer 400, as shown in FIG. 7.

In Step S300, a first interconnection hole is formed on the first insulating layer, the first interconnection hole penetrates through the inter-chip fine wiring layer and reaches the high-density inter-chip interconnection pins of the chip, and the first interconnection hole is electrified, so that the inter-chip fine wiring layer is electrically connected with the high-density inter-chip interconnection pins of the chip.

As shown in FIG. 8, a first interconnection hole 410 is formed on the first insulating layer 400, and there are a plurality of first interconnection holes 410, all of which are formed from the side of the first insulating layer 400 away from the chip 100 (the lower side in FIG. 8) toward one side of the chip 100, and the first interconnection hole 410 extends to the high-density inter-chip interconnection pin 101 of the chip 100. Optionally, the first interconnection hole 410 is formed by means of laser drilling, or is formed by means of photolithography or dry etching. When forming the first interconnection hole 410 and performing subsequent steps, the structure shown in FIG. 8 can be turned over for processing.

Figure 9:
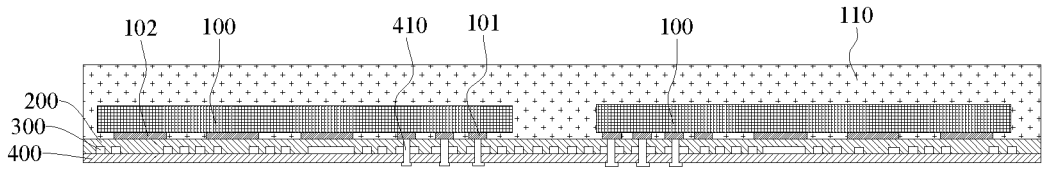

The conductive material is then filled in the first interconnection hole 410 to realize electrification. Optionally, a specific manner of electrifying the first interconnection hole 410 is to use a copper electroplating process to fill the first interconnection hole 410 with copper (as shown in FIG. 9). Of course, in an optional implementation manner, the inner wall of the first interconnection hole 410 is covered with copper, which can also realize the electrical connection between the inter-chip fine wiring layer 300 and the high-density inter-chip interconnection pins 101 of the chip 100.

In Step S400, at least one insulating layer and at least one package wiring layer are alternately formed on the first insulating layer, and each package wiring layer is electrically connected with the low-density chip interconnection pins of the chip, and/or at least one of the previously formed wiring layers, through interconnection holes.

With the production of the chip fine line fan-out package structure 010 in FIG. 1 as an example, two insulating layers and two packaging wiring layers are formed on the first insulating layer 400. Step S400 specifically comprises: forming a second insulating layer 500 on the side of the first insulating layer 400 away from the chip 100; forming a second interconnection hole 510 on the second insulating layer 500, wherein the second interconnection hole 510 is connected with the low-density chip pins of the chip 100 and/or the inter-chip fine wiring layer 300; depositing metal material on the second insulating layer 500, and electrifying the second interconnection hole 510 and etching the metal material on the second insulating layer 500 to form a first packaging wiring layer 600; forming a third insulating layer 700 on the first packaging wiring layer 600; forming a third interconnection hole 710 on the third insulating layer 700, wherein the third interconnection hole 710 is connected with the first packaging wiring layer 600; and depositing metal material on the third insulating layer 700, electrifying the third interconnection hole 710 and etching the metal material on the third insulating layer 700 to form a second packaging wiring layer 800. It should be understood that, in the present application, the second interconnection holes 510 are connected to the low-density chip pins of the chip 100 and/or the inter-chip fine wiring layer 300, which means that the plurality of second interconnection holes 510 are all connected to the low-density chip pins of the chip 100, or all of them are connected to the inter-chip fine wiring layer 300, or some of them are connected to the low-density chip pins of the chip 100, and the other part is connected to the inter-chip fine wiring layer 300.

Figure 10:
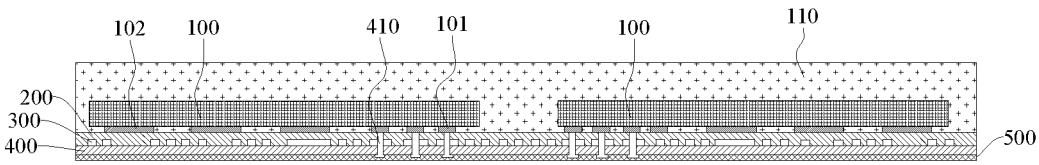

As shown in FIG. 10, a second insulating layer 500 is first formed on the first insulating layer 400 to cover the copper filled in the first interconnection holes 410.

Figure 11:
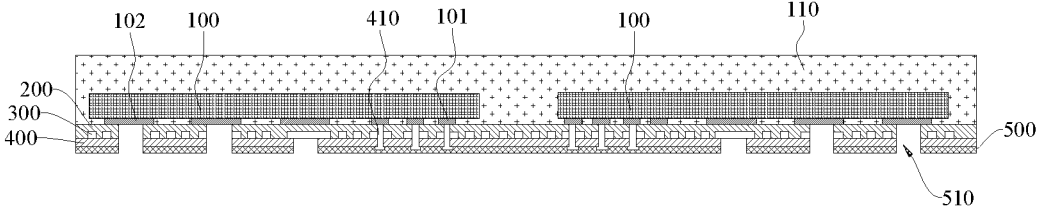

As shown in FIG. 11, a plurality of second interconnection holes 510 are then formed on the second insulating layer 500 in a manner similar to that of the first interconnection holes 410, and details are not described herein again. As shown in FIG. 11, the second interconnection holes 510 are of various forms, wherein the first one is to extend only to the inter-chip fine wiring layer 300, exposing part of the lines of the inter-chip fine wiring layer 300; the second one is to pass through the lines of the inter-chip fine wiring layer 300 and extend to the low-density chip pins 102 of the chip 100; and the third one is that it penetrates through the inter-chip fine wiring layer 300, but is not electrically connected directly to the inter-chip fine wiring layer 300, and extends to the low-density chip interconnection pins 102 of the chip 100, and thus it is not connected with the lines of the inter-chip fine wiring layer 300. The second interconnection holes 510 of these three forms provide three interconnection manners.

Figure 12:
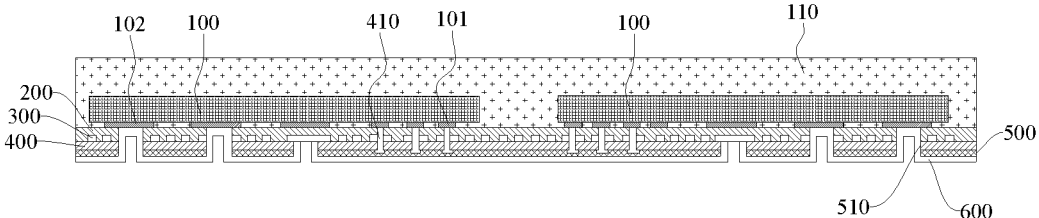
Figure 13:
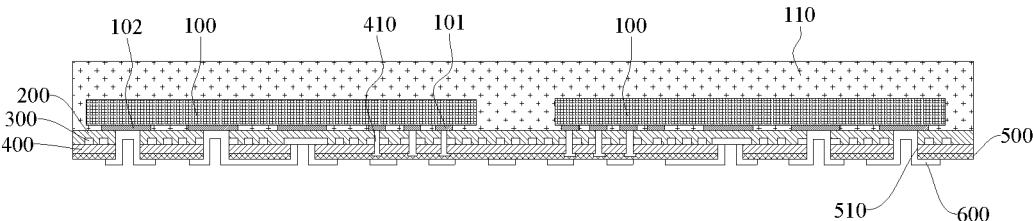

As shown in FIG. 12, after forming the second interconnection holes 510, a seed layer (titanium, copper or an alloy of the two) is magnetron sputtered on the second insulating layer 500. Then, photoresist is coated, the photolithography is performed (the second interconnection holes 510 and the line pattern are exposed after the exposure and development), and copper is plated with a copper electroplating process, which makes the second interconnection holes 510 electrified (in FIG. 12, only the inner wall of the second interconnection hole 510 is covered with copper), and at the same time, the lines of the first package wiring layer 600 are partially also plated with copper. Then, the photoresist is removed to expose the seed layer, and this part of the seed layer is removed by a dry method or a wet method, to obtain a first package wiring layer 600, as shown in FIG. 13.

Figure 14:
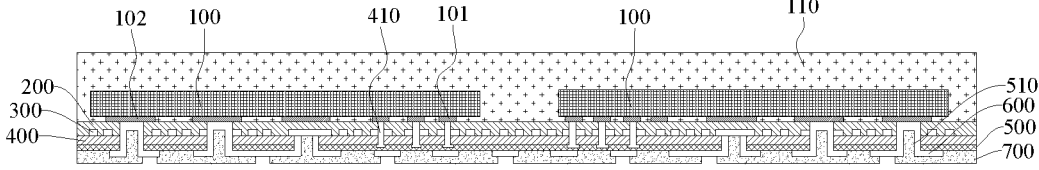

As shown in FIG. 14, a third insulating layer 700 is formed on the first packaging wiring layer 600, and a part of the material of the third insulating layer 700 is filled in the second interconnection holes 510. Then, a third interconnection hole 710 is formed on the third insulating layer 700, and the third interconnection hole 710 is connected to the lines of the first package wiring layer 600. The forming method of the third interconnection hole 710 is similar to that of the first interconnection hole 410, which will not be repeated here.

Figure 15:
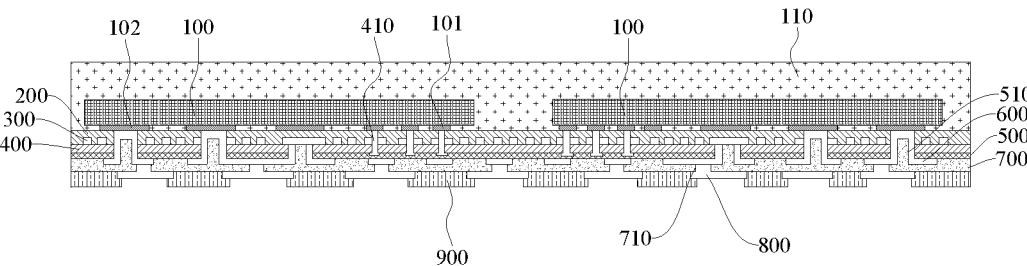

As shown in FIG. 15, metal material is deposited on the third insulating layer 700, and the third interconnection hole 710 is electrified, and the metal material on the third insulating layer 700 is etched to form a second packaging wiring layer 800. The manner of fabricating the second package wiring layer 800 and the manner of electrifying the third interconnection hole 710 are similar to those of fabricating the first package wiring layer 600 and electrifying the second interconnection hole 510, except that when the third interconnection hole 710 is electrified by the copper electroplating process, the third interconnection hole 710 is completely filled with copper. The manufacturing method of the embodiment of the present application further comprises forming a solder resist layer 900 on the package wiring layer farthest from the chip 100, the solder resist layer 900 is provided with a gap. Through the gap formed in the solder resist layer 900, the solder balls 910 are connected to the package wiring layer furthest away from the chip 100, and finally the chip fine line fan-out package structure 010 as shown in FIG. 1 is obtained. In FIG. 14, the second packaging wiring layer 800 is the packaging wiring layer farthest from the chip 100, and is also the packaging wiring layer with the widest line width and line spacing. Therefore, a solder resist layer 900 is provided on the second package wiring layer 800, and the solder balls 910 are connected to the lines of the second package wiring layer 800 to realize the electrical connection with the second package wiring layer 800.

It should be understood that, in other optional embodiments, the second package wiring layer 800 may also be connected to the low-density chip pins 102 of the chip 100 or to the inter-chip fine wiring layer 300.

It should be noted that, in this embodiment, the process of making individual interconnection holes electrified may be: physical vapor deposition, electroless plating, chemical vapor deposition process to prepare the seed layer of the interconnection hole, and then electroless plating or electroplating process is used to fill the conductive metal, or fill the interconnection holes with the conductive paste, solder paste, silver paste, etc. using the stencil or screen printing.

With the manufacturing method of a chip fine line fan-out package structure provided in the embodiment of the present application, a chip fine line fan-out package structure with a plurality of interconnecting wiring layers with different line widths and line spacings can be manufactured, so as to meet the various requirements of users, and at the same time, through selecting the insulating materials and the processing technology, it is possible to optimize the size and distribution of the stress of the chip fine line fan-out package structure, optimize the thermal resistance characteristics, and optimize the electrical measurement characteristics, thereby improving the performance and reliability of chip fine line fan-out package structures.

INDUSTRIAL APPLICABILITY

The chip fine line fan-out package structure provided in the present application and the package structure obtained by the manufacturing method provided in the present application enable users to select wiring layers with different line widths and line spacings for signal transmission during use, which can meet the needs of users in more scenarios.

What is claimed is:

1. A chip fine line fan-out package structure, comprising:
   a plurality of chips, wherein each of the chips comprises devices and pins which comprise high-density inter-chip interconnection pins and low-density chip interconnection pins;
   a plurality of wiring layers, wherein the plurality of wiring layers comprise an inter-chip fine wiring layer and package wiring layers, and the inter-chip fine wiring layer has a line width and a line spacing which are smaller than those of the package wiring layers;

the inter-chip fine wiring layer is connected to the chips through the high-density inter-chip pins;

a first insulating layer, the inter-chip fine wiring layer grown on the first insulating layer;

an adhesive material that completes alignment-bonding and curing of pins of the inter-chip fine wiring layer and the plurality of chips, encapsulating the chips with an encapsulation material;

first interconnection holes formed on the inter-chip fine wiring layer, and a conductive material provided in the first interconnection holes to realize electrical connection between the chips and the inter-chip fine wiring layer; and forming at least one package wiring layer on the first insulating layer, and providing insulating layers between individual package wiring layers, wherein the package wiring layers are connected to the chips or other wiring layers through interconnection holes filled with the conductive material.

2. The chip fine line fan-out package structure according to claim 1, wherein an adhesive layer is formed by insulating adhesive material or anisotropic conductive material, so that a side of each of the chips where pins are located is attached to the inter-chip fine wiring layer which is most adjacent, and the pins of the chips are precisely aligned with the inter-chip fine wiring layer.

3. The chip fine line fan-out package structure according to claim 2, wherein the first interconnection hole penetrates through the first insulating layer, the inter-chip fine wiring layer and the adhesive layer, to reach the high-density inter-chip pins of the chips, the first interconnection hole is filled with the conductive material, and the inter-chip fine wiring layer realizes electrical interconnection of the high-density inter-chip pins between different chips through the conductive material filled in the first interconnection hole.

4. The chip fine line fan-out package structure according to claim 3, wherein the insulating layers comprise a second insulating layer, the interconnection holes comprise second interconnection holes, the package wiring layers comprise a first package wiring layer, the second insulating layer covers the first insulating layer and the first interconnection holes, the first package wiring layer is disposed on the second insulating layer, the second interconnection holes penetrate through the first insulating layer and the second insulating layer to reach the inter-chip fine wiring layer, and/or, penetrate through the second insulating layer, the first insulating layer, the inter-chip fine wiring layer, and the adhesive layer to reach the low-density chip interconnection pins, only sidewalls of the second interconnection holes are coated with conductive material to realize electrical interconnection between the first package wiring layer and the inter-chip fine wiring layer and/or the low-density chip interconnection pins.

5. The chip fine line fan-out package structure according to claim 4, wherein the insulating layers further comprise a third insulating layer, the interconnection holes further comprise third interconnection holes, the package wiring layers further comprise a second package wiring layer, the third insulating layer covers the first package wiring layer, material of the third insulating layer fully fills the second interconnection holes, the third interconnection holes penetrate through the third insulating layer, the second package wiring layer is arranged on the third insulating layer and electrically connected to the first package wiring layer through the conductive material in the third interconnection holes.

6. The chip fine line fan-out package structure according to claim 5, wherein the conductive material in the first interconnection holes, the second interconnection holes and the third interconnection holes is at least one of copper, aluminum, tungsten, a conductive paste, tin-silver alloy, tin-silver-copper alloy, and gold-tin alloy.

7. The chip fine line fan-out package structure according to claim 1, wherein a line width and a line spacing of the package wiring layers are larger than those of the inter-chip fine wiring layer, the inter-chip fine wiring layer is of 0.5-2 microns, and a line width and a line spacing of the first package wiring layer are 2-5 microns.

8. The chip fine line fan-out package structure according to claim 7, wherein line widths and line spacings of all wiring layers comprising the inter-chip fine wiring layer and the package is wiring layers are gradually increasing in a direction away from the chips, and line widths of other packaging wiring layers except the first packaging wiring layer are more than 5 microns.

9. The chip fine line fan-out package structure according to claim 1, wherein material of the first insulating layer and insulating layers between individual packaging wiring layers comprises at least one of polyimide, benzocyclobutene (BCB), parylene, an industrialized liquid crystal polymer (LCP), epoxy resin, an oxide of silicon, a nitride of silicon, ceramic, an oxide of aluminum, and glass.

10. A manufacturing method of a chip fine line fan-out package structure, comprising:

forming sequentially a first insulating layer, an inter-chip fine wiring layer and an adhesive layer, on a surface of one side of a temporary support material;

attaching a plurality of chips to one side of the adhesive layer away from the inter-chip fine wiring layer, wherein pins of the chips comprise high-density inter-chip interconnection pins and low-density chip interconnection pins, and the pins of the chips are precisely aligned with the inter-chip fine wiring layer;

encapsulating the plurality of chips using encapsulating material and covering the adhesive layer;

removing the temporary support material;

forming a first interconnection hole on the first insulating layer, wherein the first interconnection hole penetrates through the first insulating layer, the inter-chip fine wiring layer and the adhesive layer and exposes high-density inter-chip pins of the chips, the first interconnection hole is filled with conductive material to make the inter-chip fine wiring layer electrically connected with the high-density inter-chip pins of the chips;

coating a second insulating layer on the first insulating layer then, wherein the second insulating layer covers the first insulating layer and the first interconnection hole, a first package wiring layer is formed on the second insulating layer; forming a second interconnection hole, wherein the second interconnection hole penetrates through the first package wiring layer, the second insulating layer, the first insulating layer and the inter-chip fine wiring layer and exposes the low-density chip interconnection pins, and/or, penetrates through the first package wiring layer, the second insulating layer, and the first insulating layer to expose the inter-chip fine wiring layer; the second interconnection hole is filled with conductive material, and the low-density chip interconnection pins are electrically connected to the inter-chip fine wiring layer and the first package wiring layer through the conductive material in the second interconnection hole;

forming alternately at least one insulating layer and at least one package wiring layer on the first packaging wiring layer in a direction of away from the chips, wherein interconnection holes are formed on each insulating layer, and the interconnection holes are filled with conductive material; and forming electrical connection between individual packaging wiring layers through the conductive material in the interconnection holes, wherein a line width and a line spacing of the inter-chip fine wiring layer are smaller than those of individual packaging wiring layers; and providing a pin pad on a package wiring layer farthest from the chips, wherein a solder resist layer covers the package wiring layer farthest from the chips, and the solder resist layer at least partially covering the pin pad is removed, and solder balls grow on the pin pad.

11. The manufacturing method of a chip fine line fan-out package structure according to claim 10, wherein a line width and a line spacing of individual wiring layers, comprising the inter-chip fine wiring layer, the first packaging wiring layer and other packaging wiring layers, gradually increase in a direction away from the chips.

12. The manufacturing method of a chip fine line fan-out package structure according to claim 10, wherein by the conductive material in the second interconnection hole, the low-density chip interconnection pins are electrically connected with the first package wiring layer, and/or the inter-chip fine wiring layer is electrically connected with the first package wiring layer.

13. The manufacturing method of a chip fine line fan-out package structure according to claim 10, wherein the conductive material is coated on sidewalls and a bottom of the second interconnection hole, and remaining space in the second interconnection hole is fully filled with material of the third insulating layer, or the second interconnection hole is fully filled with the conductive material.

14. The manufacturing method of a chip fine line fan-out package structure according to claim 10, wherein a step of filling the conductive material in each of the interconnection holes comprises:

forming, by magnetron sputtering or electroless plating, seed layer metal on sidewalls and a bottom of the interconnection holes, and filling the conductive material in the interconnection holes by electroplating process; or filling fully the conductive material in the interconnection holes by a method of screen/stencil printing conductive material.

15. The manufacturing method of a chip fine line fan-out package structure according to claim 14, wherein the interconnection holes are formed by laser drilling, or formed by photolithography and dry etching.

16. A method of manufacturing the fine line fan-out package structure of claim 1, comprising:

laying a first insulating layer on a temporary support material, and making the inter-chip fine wiring layer grow on the first insulating layer;

using an adhesive material to complete alignment-bonding and curing of pins of the inter-chip fine wiring layer and the plurality of chips, performing plastic package on the chips, and then removing the temporary support material;

forming first interconnection holes on the inter-chip fine wiring layer, and providing a conductive material in the first interconnection holes to realize electrical connection between the chips and the inter-chip fine wiring layer; and forming at least one package wiring layer on the first insulating layer, and providing insulating layers between individual package wiring layers, wherein the package wiring layers are connected to the chips or other wiring layers through interconnection holes filled with the conductive material.

17. The chip fine line fan-out package structure according to claim 16, comprising forming an adhesive layer by insulating adhesive material or anisotropic conductive material, so that a side of each of the chips where pins are located is attached to the inter-chip fine wiring layer which is most adjacent, and the pins of the chips are precisely aligned with the inter-chip fine wiring layer.

18. The chip fine line fan-out package structure according to claim 17, wherein penetrating the first interconnection hole the first insulating layer, the inter-chip fine wiring layer and the adhesive layer, to reach the high-density inter-chip pins of the chips, the first interconnection hole is filled with the conductive material, and the inter-chip fine wiring layer realizes electrical interconnection of the high-density inter-chip pins between different chips through the conductive material filled in the first interconnection hole.

19. The chip fine line fan-out package structure according to claim 18, wherein the insulating layers comprise a second insulating layer, the interconnection holes comprise second interconnection holes, the package wiring layers comprise a first package wiring layer, the second insulating layer covers the first insulating layer and the first interconnection holes, the first package wiring layer is disposed on the second insulating layer, the second interconnection holes penetrate through the first insulating layer and the second insulating layer to reach the inter-chip fine wiring layer, and/or, penetrate through the second insulating layer, the first insulating layer, the inter-chip fine wiring layer, and the adhesive layer to reach the low-density chip interconnection pins, only sidewalls of the second interconnection holes are coated with conductive material to realize electrical interconnection between the first package wiring layer and the inter-chip fine wiring layer and/or the low-density chip interconnection pins.

20. The chip fine line fan-out package structure according to claim 19, wherein the insulating layers further comprise a third insulating layer, the interconnection holes further comprise third interconnection holes, the package wiring layers further comprise a second package wiring layer, the third insulating layer covers the first package wiring layer, material of the third insulating layer fully fills the second interconnection holes, the third interconnection holes penetrate through the third insulating layer, the second package wiring layer is arranged on the third insulating layer and electrically connected to the first package wiring layer through the conductive material in the third interconnection holes.

* * * * *